United States Patent

[11] 3,622,900

[72] Inventors George M. Hanus
Norridge;
Alfred R. Lucas, Northbrook; Frank R. Skutta, Mount Prospect, all of Ill.
[21] Appl. No. 861,721
[22] Filed Sept. 29, 1969
[45] Patented Nov. 23, 1971
[73] Assignee Motorola, Inc.
Franklin Park, Ill.

[54] SQUELCHABLE DIRECT COUPLED TRANSISTOR AUDIO AMPLIFIER CONSTRUCTED IN INTEGRATED CIRCUIT
20 Claims, 2 Drawing Figs.

[52] U.S. Cl. ..................................................... 330/26, 330/18, 330/30 D, 330/38 M
[51] Int. Cl. ..................................................... H03f 3/68
[50] Field of Search ..................................................... 330/26, 30, 30 D, 69,38 M

[56] References Cited
UNITED STATES PATENTS

| | | | |
|---|---|---|---|
| 3,320,543 | 5/1967 | Hopengarten et al. ....... | 330/26 X |
| 3,374,441 | 3/1968 | Karcher ....................... | 330/30 |

OTHER REFERENCES

Bronzite, " A Wideband D.C. Amplifier for an Inductive Load," Electronic Engineering, January 1966, pp. 24– 30 330– 30 D Estep, " New Linear IC Amplifier Offers Flexibility," This Electronic Engineer, April 1967, pp. 58– 60 330– 30 D

*Primary Examiner*—Roy Lake
*Assistant Examiner*—James B. Mullins
*Attorney*—Mueller & Aichele

ABSTRACT: Direct coupled transistorized operational amplifier including differential amplifier input circuit, Darlington connected transistor driver, and high-efficiency output stage. To turn the amplifier on and off, bias potentials are applied to the differential amplifier in a manner to prevent audio transients. A control circuit controls the charging of capacitors to provide the bias potentials. The amplifier is constructed in integrated circuit form with compensation for temperature and frequency characteristics of substrate PNP and ring collector lateral PNP-transistors, and for input to output phase shift through the amplifier.

INVENTORS
GEORGE M. HANUS
ALFRED R. LUCAS
FRANK R. SKUTTA
BY Mueller, Aichele & Rauner
ATTYS.

SQUELCHABLE DIRECT COUPLED TRANSISTOR AUDIO AMPLIFIER CONSTRUCTED IN INTEGRATED CIRCUIT

BACKGROUND OF THE INVENTION

It is desirable to use direct coupled transistors in amplifiers so that they can be constructed in integrated circuit form to thereby reduce the size and cost. It is further desired that audio amplifiers for battery powered receivers have low current drain and that they be capable of being turned off when no signal is present to eliminate the annoyance of listening to unwanted signals. However, direct coupled transistor amplifiers have produced transients when the amplifier is turned on and off, so that such amplifiers have not been suitable for squelch operation. These transients or "pops" occur when the amplifier is turned on before the transistors reach their quiescent operating point.

It is also desired that the audio amplifier of a portable receiver provide a reasonably good frequency response while operating over a wide temperature range. The amplifier must also provide maximum output from a given supply voltage, and must operate satisfactorily in the presence of variations of the supply voltage, which may be a battery having a voltage which varies with the condition of charge. Further, it is desired that the integrated circuit amplifier not be damaged by accidental short circuits which might occur in the load.

SUMMARY OF THE INVENTION

It is an object of the present invention to provide an audio amplifier that can be constructed in integrated circuit form and which can be turned on and off without producing an audio transient.

A further object of the invention is to provide a squelchable direct coupled audio amplifier including transistor stages formed as an integrated circuit, with compensation for the transistor characteristics to provide a good frequency response over a wide temperature range.

Another object of the invention is to provide a control circuit for a differential amplifier including transistors connected as first and second Darlington pairs, wherein the input and output are coupled to the first pair and the bias potential applied to the first pair is less than that applied to the second pair when the amplifier is turned on.

A still further object of the invention is to provide an output stage for an audio amplifier wherein substantially the full supply voltage is available at the amplifier output.

Still another object of the invention is to provide an integrated circuit audio amplifier wherein the bias and drive to the output transistors are arranged so that temporary application of output loads does not damage these transistors.

In practicing the invention, an integrated circuit audio amplifier is provided including a differential amplifier input circuit followed by transistors connected as a Darlington pair which drive an emitter coupled output stage. Darlington coupled transistors are used on each side of the differential input circuit to provide a high input impedance. The Darlington connected driver stage includes a substrate PNP-transistor and a ring collector lateral PNP-transistor which supply the current necessary to drive one output transistor to provide the positive half cycles of the output signal. A Darlington connected pair of PNP-transistors are connected in a bootstrap resistor circuit to the output to drive the second output transistor to provide the negative half cycles of the output signal.

The signal is applied to the Darlington pair on one side of the differential amplifier and bias is applied thereto by a circuit including a capacitor. Bias is applied to the Darlington pair forming the second side of the differential amplifier by a circuit connected to a fixed potential. To turn the amplifier on, the capacitor is charged and the amplifier becomes operative when the voltage thereon reaches the fixed potential. A feedback circuit from the output increases the bias applied to the second side above the fixed potential so that the two bias voltages rise together, until they reach the operating point. For turn off, the capacitor is discharged rapidly so that the amplifier is turned off without producing a transient.

DESCRIPTION OF THE PREFERRED EMBODIMENT

Figures 1, 2:
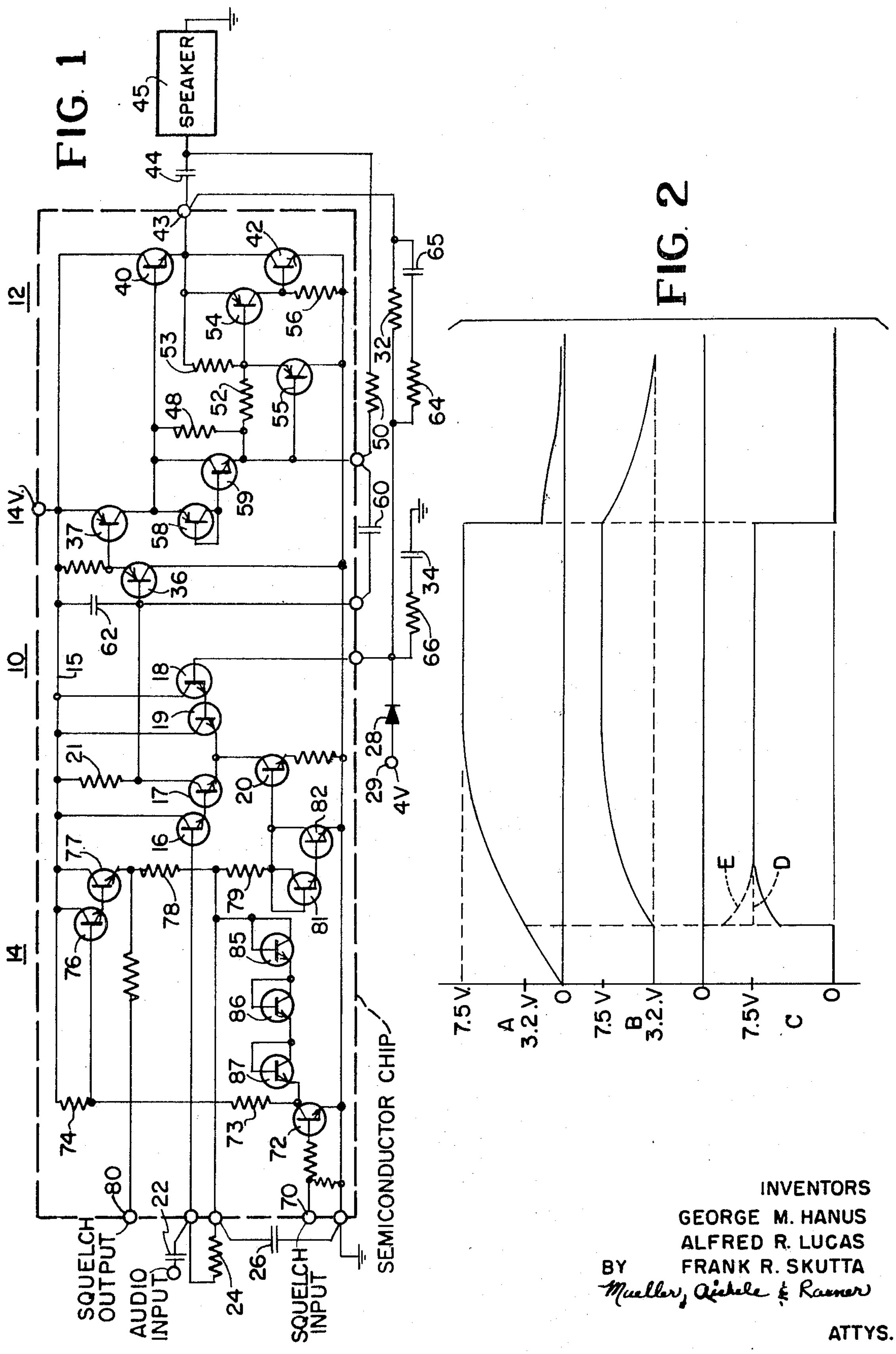
FIG. 1 is a circuit diagram of the amplifier of the invention showing the parts constructed as an integrated circuit, and the external parts and connections.
FIG. 2 is a chart showing the operation of the amplifier of FIG. 1.

Referring now to the circuit diagram of FIG. 1, the squelchable amplifier circuit shown is a noninverting operational differential amplifier. This amplifier includes three main sections; the differential amplifier input circuit or portion 10, the amplifier output circuit or portion 12, and the control or switching portion 14. All three portions are energized by the supply potential on conductor 15, which may have a value of 14 volts. The differential amplifier portion includes four transistors connected as two Darlington pairs in a balanced arrangement. The first pair is formed by transistors 16 and 17 and the second pair by transistors 18 and 19. Differential amplifiers including pairs of transistors connected in a Darlington configuration are known in the art. Constant emitter current for the differential amplifier is supplied by transistor 20.

Input signals are applied to the base electrode of transistor 16 through capacitor 22. The Darlington coupled differential amplifier has a high input impedance. A bias voltage is developed for the base of transistor 16 by capacitor 26 coupled to the base by resistor 24. A reference voltage is applied to the base of transistor 18 by diode 28 connected to terminal 29, which may provide a 4-volt potential, and by the feedback circuit from the amplifier output formed mainly by resistor 32.

The feedback circuit will be explained more fully subsequently. When the voltage applied to the base of transistor 16 exceeds the initial reference voltage at the base of transistor 18, the differential amplifier will provide an output signal at the collector of transistor 17. Conduction of transistor 17 will provide current through load resistor 21 to drop the voltage at the collector of transistor 17, to thereby provide the output signal.

The differential amplifier 10 is coupled to the emitter coupled amplifier output circuit 12 by transistors 36 and 37, which are also connected as a Darlington pair. The output circuit includes output transistors 40 and 42 which together provide the output current. Transistor 40 conducts during the positive half of the output cycle and transistor 42 during the negative half of the cycle. The common connection between the emitter of transistor 40 and the collector of transistor 42 provides the output current at terminal 43, which is coupled through capacitor 44 to the output load 45. The output load may be a loudspeaker having an impedance of the order of 35 ohms.

The collector of transistor 37 is directly connected to the base of output transistor 40 to apply current thereto to control the transistor 40. The Darlington pair formed by transistors 36 and 37 provide the current gain necessary to drive transistor 40 during the positive half of the cycle. When transistor 40 conducts, the voltage supplied to the output terminal 43 is the full supply voltage on conductor 15, reduced only by the saturation voltage of transistor 37 and the base to emitter drop of transistor 40. The collector current for transistor 37 is supplied through transistors 58 and 59, which are connected to the bootstrap circuit including bootstrap resistor 50 connected to the amplifier output. The potential at the emitter of transistor 59 is applied through resistor 52 to the base of transistor 54, which drives the output transistor 42. The base and emitter of transistor 55 are connected across resistor 52, and when the voltage across resistor 52 reaches a given value, transistor 55 will conduct to increase the drive to transistor 54. This in turn increases the drive to the output transistor 42.

When transistor 42 conducts the output terminal is almost at ground, being above ground by the saturation voltage of transistor 54 and the base to emitter drop of transistor 42.

Bias transistors 58 and 59 act to compensate for the base to emitter characteristics of transistors 54 and 40 respectively. Transistors 58 and 54 are ring collector lateral PNP-transistors and transistors 59 and 40 are double emitter power transistors. The resistor 48 connected across the transistors 58 and 59, and the resistor 53 connected between the base and emitter of transistor 54 act to prevent thermal (direct current) runaway which might take place because of the leakage of the transistors which may be formed as integrated circuit lateral PNP-transistors. Resistors 52 and 53 form a voltage divider to prevent thermal runaway from occurring in the output circuit.

As previously stated, a connection is made from the output through resistor 50 to the drive circuit for transistor 42. This bootstrap circuit forms a current source to compensate for the beta fall off characteristic of driver transistor 54. This circuit is also connected by capacitors 60 and 62 to the base of transistor 36 to provide frequency compensation, and is chosen such that the compensated open loop response of the amplifier intersects the zero decibel gain point at a rate of 6 decibels per octave. Capacitor 60 is a pole-splitting capacitor which moves one of the poles of the open loop response lower in frequency and another pole higher in frequency. Capacitor 62 is a lag capacitor which moves a pole lower in frequency. With this compensating network the circuit is stable with any gain from 0 to 50 decibels.

The gain and frequency response of the overall amplifier is controlled by the feedback circuit including resistor 34 which provides bias to the base of the transistor 18. Resistor 64 and capacitor 65 are connected in series across resistor 32, with capacitor 65 providing high-frequency rolloff and helping eliminate crossover distortion caused by the class B operation. The feedback voltage is developed across resistor 66 and capacitor 34, the values of which are selected to provide low frequency rolloff.

Considering now the circuit for squelching the amplifier, this is arranged to turn on and off the amplifier without causing a transient or "pop" when the amplifier is turned on, or a squelch tail disturbance when the amplifier in turned off. The squelch controlling voltage is applied at terminal 70. This control voltage reduces when the amplifier is to be rendered operative, and increases when the amplifier is to be turned off.

The reduced control voltage at terminal 70 turns on the amplifier by rendering transistor 72 nonconductive. This removes the ground from resistors 73 and 74 so that transistors 76 and 77, connected as a Darlington pair, turn on. This provides substantially the fully supply voltage from conductor 15 at terminal 80, which may be used to control other equipment. Conduction of transistors 76 and 77 causes current flow through resistors 78 and 79 and transistors 81 and 82 connected in series to the ground potential. Transistors 81 and 82 have a common collector area to minimize the space required on an integrated circuit chip. These transistors provide essentially the same voltage drop as two series connected diodes.

Current flow through the transistors 81 and 82 will provide a voltage at the base of transistor 20 to render the same conducting, and this supplies emitter current for the differential amplifier. Resistors 78 and 79 form a voltage divider for charging capacitor 26. The voltage on capacitor 26 is applied through resistor 24 to the base of transistor 16 to bias the same. When the voltage at the base of transistor 16 reaches the fixed bias applied to the base of transistor 18, the transistors 16 and 17 will turn on to produce an output signal at the collector of transistor 17.

Curve A of FIG. 2 shows the voltage across capacitor 26 and shows that it charges from 0 potential to a potential substantially half of the supply voltage applied on conductor 15. This is provided by selecting the values of resistors 78 and 79 so that these resistors in combination with the base to emitter drops of transistors 76 and 77, and the base to emitter drops of transistors 81 and 82 provide the desired quiescent operating voltage across capacitor 26.

Curve B of FIG. 2 shows the voltage at the base of transistor 18. As previously stated, terminal 29 has a voltage of the order of 4 volts and this is applied through diode 28 to the base of transistor 18. The diode provides a small drop so that a voltage of the order of 3.2 volts is applied to the base of transistor 18. Accordingly, the base of transistor 18 is initially at a higher voltage than the base of transistor 16 so that transistors 18 and 19 are conducting and transistors 16 and 17 are nonconducting. When the voltage on the base of transistor 16 reaches the value of the voltage on the base of transistor 18, transistors 16 and 17 will start to conduct to provide a voltage across resistor 21. This voltage will be applied to the driver stage including transistors 36 and 37 to drive the output circuit. The output transistor 40 will, therefore, conduct to provide current through the feedback circuit to charge capacitor 34. This will cause the voltage applied to the base of transistor 18 to increase as shown by curve B of FIG. 2.

Capacitor 26 will also continue to charge at a rate and to a potential determined essentially by the values of resistors 78 and 79. The voltage applied to the base of transistor 18 will rise at a rate depending on the time constant of the feedback circuit and the voltage at the terminal 43. The action of the differential amplifier causes the voltage at the base of transistor 18 to tend to follow the voltage at the base of transistor 16 so that there will not be large current flow through the resistor 21. Accordingly the output transistor will not conduct heavily and this eliminates the possibility of an output transient or "pop." The voltage across capacitor 34 will rise at a rate equal to or less than the voltage across capacitor 26, and these voltages will stabilize at a quiescent operating voltage substantially half of the supply voltage to provide a symmetrically clipped output wave form.

Curve C of FIG. 2 shows the voltage at output terminal 43, which is the common connection between the emitter of transistor 40 and the collector of transistor 42. In the event that the time constant associated with capacitor 34 is faster than that associated with capacitor 26, the curve will have the form shown by the solid line wherein the voltage at terminal 43 will start out somewhat less than its steady state value and increase to its steady state value, which is substantially half the supply voltage. If the charging circuits of capacitors 26 and 34 have the same time constants, the output curve will rise to the steady state value and level off immediately as shown by the dotted curve D. In the event that the time constant associated with capacitor 26 is faster than that associated with capacitor 34 to provide a voltage on the base of transistor 16 which rises above that on the base of transistor 18, the voltage at output terminal 43 will have the form shown by dotted curve E. If the time constant associated with capacitor 26 is much faster than that associated with capacitor 34, the initial voltage surge at the output terminal can cause the objectionable transient previously referred to. It is, therefore, desirable that the time constant of the circuits associated with capacitors 26 and 34 be selected so that the time constant of the circuit charging capacitor 34 will be equal to or faster than that for capacitor 26.

Considering now the turn off characteristics of the amplifier, when the squelch or control voltage applied at point 70 increases, transistor 72 will be rendered conductive. This causes a voltage drop across resistor 74 to turn off transistors 76 and 77, and to render transistors 81 and 82 nonconducting. This will remove the voltage applied from the divider to capacitor 26, and capacitor 26 will discharge through the diode connected transistors 85, 86 and 87, connected in series with the collector and emitter of transistor 72, which is saturated. The voltage across capacitor 26 will drop rapidly to turn off the amplifier. The fixed voltage applied to the base of transistor 18 will prevent a secondary turn on of the differential amplifier which can produce a transient. Capacitor 26 will continue to discharge through transistors 81 and 82. This will remove the drive from transistor 20 so that it is rendered nonconducting to cut off the emitter current for the differential amplifier. The diode connected transistors 85, 86 and 87 isolate the potential at the junction between resistors 78 and 79 from the base of transistor 76 when the amplifier is turned on.

As shown by curve A of FIG. 2, the voltage applied to the base of transistor 16 drops very suddenly when the squelch voltage is applied. This causes the output voltage to drop as shown by curve C of FIG. 2. Inasmuch as the voltage is removed from the feedback circuit including resistor 32 and capacitor 34, capacitor 34 will discharge so that the voltage applied to the base of transistor 18 drops to 3.2 volts, which is applied from terminal 29 through diode 28. This is illustrated by curve B of FIG. 2.

The circuit is designed so that a large part thereof can be constructed in integrated circuit form, with all of the elements shown within the dotted line on FIG. 1 being produced on a single chip. The elements outside the dotted line are external to the chip and are connected to the circuit on the chip by the terminals shown along the dotted line. A plurality of different types of transistors are formed on the integrated circuit chip, and the following transistors are of the types indicated:

| | |
|---|---|
| Transistor 36 | Substrate PNP |
| Transistors 37, 55 | Channel emitter lateral PNP |
| Transistors 54, 58 | Ring Collector lateral PNP |
| Transistors 40, 42, 59 | Double emitter NPN power transistor |

The remaining transistors on the chip in FIG. 1 are general purpose NPN-transistors.

The matching of the respective geometry of output transistors 40 and 42, transistors 54 and 55 which drive transistor 40 and bias transistors 58 and 59, is such that temporary undesired loads which may cause current through transistors 40 and 42 to increase, will increase the temperature of the chip so that the base to emitter drops of transistors 58 and 59 will decrease. This will reduce the bias applied to transistors 40 and 54 to decrease the current therein and thereby reduce the possibility of damage to the transistors. By this action, temporary heavy currents as may be caused by accidental short circuits in the load 45 will not destroy the amplifier chip.

The audio amplifier which has been described provides a 0.5 watt output and can provide gains varying from 0 to 50 decibels. The amplifier is designed to operate with a supply voltage of 14 volts and a 35 ohm load and the current drain is about 57 milliamps for 0.5 watt output. The circuit has been found to work with supply voltages varying from 10 to 18 volts over the temperature range from −30° C. to +60° C. without significantly affecting the stability, gain, clip level, or closed loop frequency response. The amplifier responds to a squelch control voltage and turns on and off without producing undesired audio transients. The transistors on the chip are matched to prevent damage by accidental short circuits in the load.

We claim:

1. An amplifier which is adapted to be rendered operative and inoperative by a control voltage including in combination, a differential amplifier input circuit having first and second input terminals and a first output terminal, an amplifier output circuit having an input terminal coupled to said first output terminal and having a second output terminal at which an amplified signal is developed, means for applying a signal to be amplified to said first input terminal, first bias means connected to said first input terminal to apply a first bias potential thereto and including capacitor means selectively charged and discharged to control said first bias potential, second bias means connected to said second input terminal for applying a second bias potential thereto and including a first portion providing a fixed bias potential and a second portion connected to said second output terminal to increase said second bias potential above said fixed bias potential, and control means responsive to the control voltage and operative to cause said capacitor means to charge so that said first bias potential increases, said differential amplifier input circuit being rendered operative in response to said first bias potential reaching said fixed bias potential to provide a signal at said first output terminal, and said amplifier output circuit being responsive to the signal at said first output terminal to provide an amplified signal at said second output terminal, and said second bias means being responsive to the voltage at said second output terminal to increase said second bias potential as said capacitor means charges, whereby said first and second bias potentials increase to substantially the same value.

2. The amplifier of claim 1 wherein, said second portion of said second bias means is a feedback circuit including further capacitor means charged by the amplified signal at said second output terminal to increase the second bias potential.

3. The amplifier to claim 2 wherein said further capacitor means and the portion of said second bias means for charging the same are selected so that the charging circuit for said further capacitor means has a faster time constant than the charging circuit for said capacitor means of said first bias means, so that the amplifier is rendered operative without producing a transient at said second output terminal.

4. The amplifier of claim 3 wherein said feedback circuit includes frequency shaping means.

5. The amplifier of claim 1 wherein, said control means is responsive to a change in the control voltage to discharge said capacitor means to reduce said first bias voltage and thereby turn off said differential amplifier input circuit.

6. The amplifier of claim 1 wherein said control means includes a transistor having a base electrode for receiving the control voltage and collector and emitter electrodes, and diode means connected in series with said collector and emitter electrodes across said capacitor means, and wherein said transistor is rendered conductive by the control voltage to complete the circuit through said diode means to discharge said capacitor means.

7. The amplifier of claim 1 wherein, said differential amplifier input circuit includes first and second portions connected to said first and second input terminals and common means for supplying current to said first and second portions, and wherein said control means activates said common means to supply current, and said capacitor means holds said common means operative until the voltage across said capacitor means falls below a given value.

8. The amplifier of claim 7 wherein, said first and second portions of said differential amplifier input circuit each includes a pair of transistors connected in a Darlington configuration.

9. The amplifier of claim 1 further including, transistor amplifier means connected between said first output terminal and said input terminal of said amplifier output circuit.

10. The amplifier of claim 9 wherein, said transistor amplifier means includes first and second transistors connected as a Darlington pair.

11. The amplifier of claim 1 wherein, said amplifier output circuit includes a first output transistor for providing the positive portion of the amplified signal and a second output transistor for providing the negative portion of the amplified signal, each of said output transistors having a control electrode and a pair of output electrodes with said output electrodes connecting said second output terminal to the potential supply, said control electrode of said first output transistor being connected to said second input terminal, and means for driving said second output transistor including a plurality of transistors connecting said second input terminal to said control electrode of said second output transistor.

12. The amplifier of claim 11 wherein, said last recited means includes a bootstrap circuit connected to said second output terminal, and which includes frequency-compensating means.

13. An audio amplifier energized from first and second supply potential conductors including in combination, a semiconductor chip on which a plurality of circuit elements are formed, a differential amplifier input circuit formed on said chip having first and second input terminals and a first output terminal, means for applying a signal to be amplified to said first input terminal, bias means external to the semiconductor chip and connected to said first and second input terminals to apply bias potentials thereto to render said differential amplifier operative to produce a signal at said first output terminal, and an amplifier output circuit formed on said chip having an input terminal coupled to said first output terminal and having a second output terminal at which an amplified signal is developed, said amplifier output circuit including first and second output transistors each having a control electrode and a pair of output electrodes, said output electrodes of first output transistor being connected between the first supply potential conductor and said second output terminal for providing the positive portion of the amplified signal, said output electrodes of second output transistor being connected between said second supply potential conductor and said second output terminal for providing the negative portion of the amplified signal, means connecting said input terminal of said output circuit to said control electrode of said first output transistor, and means for driving said second output transistor including a first coupling transistor having a control electrode and output electrodes coupled to said control electrode of said second output transistor to drive the same, resistor means coupled between said input terminal of said amplifier output circuit and said control electrode, and a second coupling transistor connected to said resistor means and rendered conductive in response to a predetermined voltage across said resistor means to increase the drive to said first transistor.

14. The amplifier of claim 13 including semiconductor means coupled between said input terminal of said output circuit and said control electrode of said first coupling transistor having two series connected diode junctions for providing a voltage drop.

15. The amplifier of claim 14 wherein said first and second output transistors, said first and second coupling transistors and said semiconductor means are constructed to compensate for the temperature characteristics of each other.

16. The amplifier of claim 15 wherein increase in temperature of said output transistors resulting from short circuits at said second output terminal causes said first and second coupling transistors and said semiconductor means to change the bias and drive to said output transistors to prevent damage thereto.

17. The amplifier of claim 13, wherein said means for driving said second output transistor further includes a bootstrap circuit connected from said second output terminal to said resistor means to compensate for the characteristics of said first coupling transistor.

18. The amplifier of claim 17 wherein, said bootstrap circuit includes frequency compensating means coupled to said input terminal of said amplifier output circuit.

19. The amplifier of claim 13 further including, transistor amplifier means connected between said first output terminal and said input terminal of said amplifier output circuit which includes first and second transistors connected as a Darlington pair.

20. An audio amplifier energized from first and second supply potential conductors including in combination, a semiconductor chip on which a plurality of circuit elements are formed, a differential amplifier input circuit formed on said chip having first and second input terminals and a first output terminal, means for applying a signal to be amplified to said first input terminal, bias means external to the semiconductor chip and having first and second portions connected to said first and second input terminals, respectively, to apply bias potentials thereto to render said differential amplifier operative to produce a signal at said first output terminal, an amplifier output circuit formed on said chip having an input terminal coupled to said first output terminal and having a second output terminal at which an amplified signal is developed, said amplifier output circuit including first and second output transistors each having a control electrode and a pair of output electrodes, said output electrodes of said first output transistor being connected between the first supply potential conductor and said second output terminal for providing the positive portion of the amplified signal, said output electrodes of second output transistor being connected between said second supply potential conductor and said second output terminal for providing the negative portion of the amplified signal, means connecting said input terminal of said output circuit to said control electrode of said first output transistor, and means for driving said second output transistor including transistor means coupling said input terminal of said output circuit to said control electrode of said second output transistor, said second portion of said bias means having a portion connected to said second output terminal to provide a bias potential at said second input terminal which follows the bias potential applied to said first input terminal, and control means connected to said first portion of said bias means for controlling the bias potential applied to said first input terminal to selectively render said differential amplifier circuit operative.

* * * * *